United States Patent
Wong et al.

(10) Patent No.: US 6,972,987 B1
(45) Date of Patent: Dec. 6, 2005

(54) TECHNIQUES FOR REDUCING POWER CONSUMPTION IN MEMORY CELLS

(75) Inventors: Myron Wai Wong, Fremont, CA (US); Thomas H. White, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 6 days.

(21) Appl. No.: 10/856,187

(22) Filed: May 27, 2004

(51) Int. Cl.[7] .............................................. G11C 11/00
(52) U.S. Cl. ...................................... 365/154; 365/156
(58) Field of Search ................................ 365/154, 156, 365/230.05

(56) References Cited

U.S. PATENT DOCUMENTS

| | | | |
|---|---|---|---|
| 4,750,155 A * | 6/1988 | Hsieh | 365/203 |
| 5,237,219 A | 8/1993 | Cliff | |
| 5,831,896 A * | 11/1998 | Lattimore et al. | 365/154 |
| 5,901,079 A * | 5/1999 | Chiu et al. | 365/154 |
| 5,986,923 A * | 11/1999 | Zhang et al. | 365/154 |
| 6,128,215 A | 10/2000 | Lee | |
| 6,853,578 B1 * | 2/2005 | Zhang et al. | 365/154 |

* cited by examiner

*Primary Examiner*—Anh Phung
(74) *Attorney, Agent, or Firm*—Townsend and Townsend and Crew LLP

(57) ABSTRACT

Techniques are provided for reducing power consumption in memory cells. A static (SRAM) memory cell includes two cross coupled inverters. One or more transistors are coupled between the inverters and the power supply voltages. The transistors are turned OFF for a period of time during a memory state transition to block current flow between the high power supply voltage and the low power supply voltage to reduce power consumption.

20 Claims, 4 Drawing Sheets

TECHNIQUES FOR REDUCING POWER CONSUMPTION IN MEMORY CELLS

BACKGROUND OF THE INVENTION

The present invention provides techniques for reducing power consumption in memory cells, and more particularly, to techniques for blocking current paths between high and low power supply voltages in memory cells during voltage transitions.

Programmable integrated circuits (ICs) can be programmed to implement many types of circuit designs. Examples of programmable integrated circuits include programmable logic devices (PLDs), complex programmable logic devices (CPLDs), field programmable gate arrays (FPGAs), programmable logic arrays (PLAs), and configurable logic arrays (CLAs).

Programmable ICs typically include programmable logic blocks, programmable routing blocks, and control memory blocks. Configuration data is used to program the functionality of the programmable logic and routing blocks. The configuration data is stored in control memory blocks and used to configure the logic blocks as needed. The control memory blocks often contain static random access memory (SRAM) cells and are referred to as CRAM cells.

A typical CRAM cell includes two cross coupled inverters. The two inverters are coupled between a CRAM input terminal and a CRAM output terminal. The CRAM input terminal is coupled to the output of the first inverter and the input of the second inverter. The CRAM output terminal is coupled to the output of the second inverter and the input of the first inverter.

A data bit is stored in a CRAM cell by pulling the CRAM input terminal HIGH or LOW through a pass transistor. A CRAM cell can be set by pulling the CRAM output terminal HIGH or by pulling the input terminal LOW. A CRAM cell is reset by pulling the CRAM output terminal LOW or pulling the input terminal HIGH. A data bit is read from the CRAM cell through the CRAM output terminal.

During the period of time when the output voltages of the inverters transition from HIGH to LOW or LOW to HIGH, current flows between the high and low power supply voltages through the inverters. Current also flows through the CRAM reset pull down or CRAM write transistor paths. Current consumption can be large during this period of time, for example, when a large number of CRAM cells are set or reset concurrently.

When an FPGA is powered up, this current consumption can be especially problematic. During an FPGA power-up phase, the CRAM set and reset events may take a longer time. The current path between the high and low supply voltages through the CRAM inverters draws current for a longer period of time during power-up. Current draw at this time can be especially undesirable, because an FPGA is more sensitive to current draw during power-up due to the high current load placed on the external power supply causing a system power supply droop.

It would therefore be desirable to provide techniques for reducing power consumption in memory cells during CRAM reset or set transitions.

BRIEF SUMMARY OF THE INVENTION

The present invention provides techniques for reducing power consumption in memory cells. A static (SRAM) memory cell typically includes two cross coupled inverters. Additional transistors are coupled between the inverters and the power supply voltages. The additional transistors are turned OFF for a period of time during a voltage transition to block current flow between the high and low power supply voltages during, for example, a set, a reset, or a write cycle.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
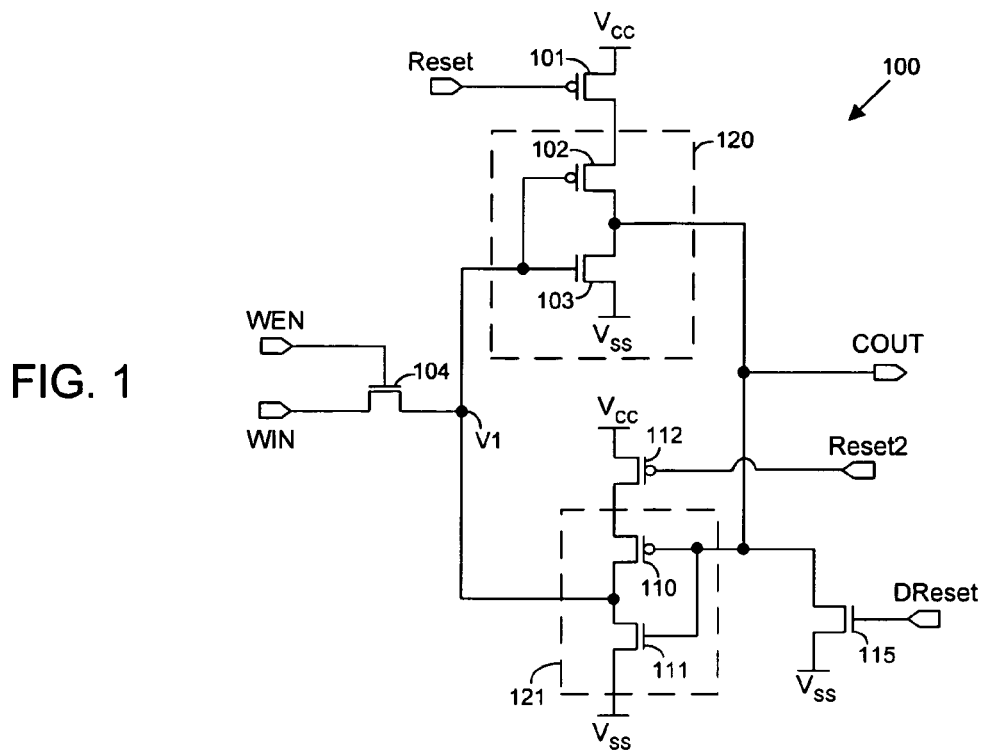
FIG. 1 is a schematic diagram of a memory cell with reduced power consumption according to an embodiment of the present invention.

FIG. 1 illustrates a first embodiment of the present invention. Memory cell 100 includes two cross coupled inverters 120 and 121. Inverter 120 includes PMOS transistor 102 and NMOS transistor 103. Inverter 121 includes PMOS transistor 110 and NMOS transistor 111. COUT is the output terminal of memory cell 100.

WIN is a write input terminal, and WEN is a write enable input terminal. A data bit can be stored in memory cell 100 by pulling the voltage at WEN HIGH. When the voltage at WEN goes HIGH, NMOS transistor 104 turns ON. A voltage signal at WIN can now cause the voltage V1 to change state.

After voltage V1 changes state, inverter 121 causes the voltage at output terminal COUT to change state. Inverter 121 pulls the voltage signal at COUT to the opposite digital state as the voltage signal at WIN when transistor 104 is ON. The voltage at WIN can be pulled HIGH to cause the voltage at COUT to go LOW or pulled LOW to cause the voltage at COUT to go HIGH. Memory cell 100 can be set by pulling the voltage at WIN LOW when transistor 104 is ON.

Memory cell 100 also includes NMOS transistor 115. The gate of transistor 115 is coupled to DReset. Memory cell 100 can be reset by pulling the voltage at DReset HIGH. Resetting memory cell 100 causes the output voltage at COUT to go LOW. Pulling the voltage at DReset HIGH, causes transistor 115 to turn ON. The voltage at COUT is pulled LOW through transistor 115.

The signal provided to DReset can feed into multiple memory cells in a memory array. The memory cells in the array can be reset by pulling the voltage at DReset HIGH. DReset is useful for clearing data stored in a memory array (e.g., during system power-up).

When the input voltages of invertors 120 and 121 change state, current is drawn between the high power supply voltage ($V_{CC}$) and the low power supply voltage ($V_{SS}$) for a period of time through transistors 102–103 and through transistors 110–111. The current drawn between the power supply voltages causes excessive power consumption. Therefore, it is desirable to reduce the period of time that both the PMOS and NMOS transistors in inverters 120 and 121 are ON during voltage transitions.

PMOS transistors 101 and 112 have been added to memory cell 100 to reduce the period of time that the transistors in inverters 120 and 121 are ON. The gate of transistor 101 is coupled to receive a signal at Reset, and the gate of transistor 112 is coupled to receive a signal at Reset2.

Figure 2A:
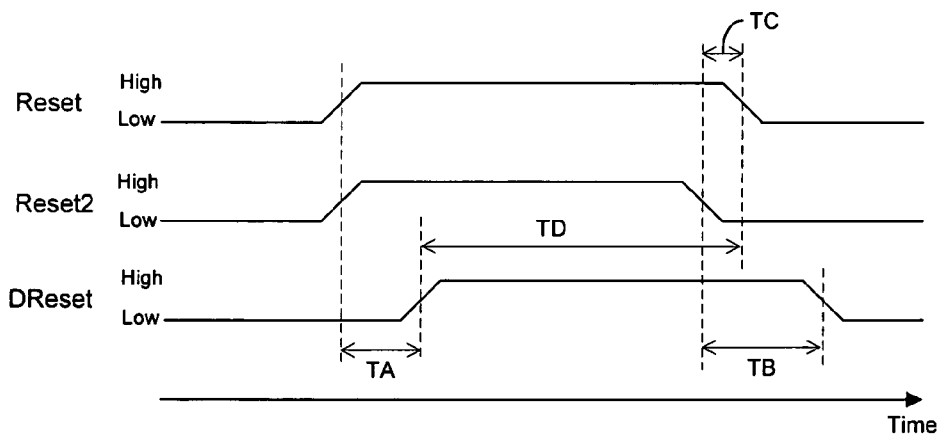
FIG. 2A is a timing diagram that illustrates examples of three input signals that can be used to reset the memory cell of FIG. 1.

FIG. 2A is a timing diagram that illustrates examples of waveforms for voltages at the Reset, Reset2, and DReset terminals. Before memory cell 100 is reset, the voltages at the Reset and Reset2 terminals go HIGH, turning transistors 101 and 112 OFF to block current flow between supply voltages $V_{CC}$ and $V_{SS}$ through inverters 120–121.

Memory cell 100 is reset when the voltage at DReset goes HIGH, a period of time TA after the voltages at Reset and Reset2 go HIGH. When the voltage at DReset goes HIGH, transistor 115 turns ON, and the voltage at COUT is pulled LOW ($V_{SS}$) to reset memory cell 100.

Without PMOS transistor 101, PMOS transistor 102 is ON during reset if its input voltage is LOW. If PMOS transistor 102 is ON, current flows from $V_{CC}$ through transistor 115 to $V_{SS}$, when transistor 115 turns ON. Thus, transistors 102 and 115 would create a direct current path between the high and low power supplies ($V_{CC}$ and $V_{SS}$) causing unwanted power consumption.

However, in memory cell 100 of the present invention, the current path through transistors 102 and 115 is blocked by transistor 101 during reset. Before a reset, transistor 101 is turned OFF when the voltage at Reset goes HIGH as shown in FIG. 2A. Power consumption is reduced while the output voltage at COUT is pulled LOW, because the current path between $V_{CC}$ and $V_{SS}$ is blocked by transistor 101 during time TD. Therefore, transistor 115 can pull the voltage at COUT LOW more easily without unwanted current from $V_{CC}$.

After the voltage at COUT is pulled LOW, the voltage at Reset2 goes LOW as shown in FIG. 2A. The voltage at Reset goes LOW a delay TC after the voltage at Reset2 goes LOW. The voltage at DReset remains HIGH a period of time TB after Reset2 goes LOW, as shown in FIG. 2A. During period TB, transistors 101 and 112 are ON, and inverters 120–121 conduct current causing the output voltage V1 of inverter 121 to go HIGH if was initially LOW.

Thus, the present invention cuts off a direct current path between the high and low supply voltages to reduce power consumption during time period TD. In prior art circuits, current can flow between the high and low power supplies during the entire period of time that a memory cell is reset. In memory cell 100 of the present invention, current does not flow between the high and low power supply voltages during time TD when the memory cell is reset.

The present invention can reduce power consumption during any voltage transitions in a memory cell. For example, the present invention can reduce power consumption when a data HIGH or LOW bit is written into a memory cell. The present invention can reduce power consumption during set condition, reset conditions, and write phases.

The techniques of the present invention can be used to reduce power consumption during a set condition and when data is written into a memory cell. The circuitry shown in FIG. 1 can be used for these embodiments, as will now be discussed.

During a write phase condition, a digital data bit is applied to the WIN terminal and stored in memory cell 100. To initiate a write phase, a HIGH voltage is transmitted to the write enable (WEN) terminal to turn transistor 104 ON.

Without transistors 101 and 112, current could flow between $V_{CC}$ and $V_{SS}$ during a write phase through inverters 120–121, causing unwanted power consumption. As an example, if the voltage at COUT is initially at $V_{SS}$, transistor 110 is ON. If $V_{SS}$ is applied at WIN, current flows between $V_{CC}$ and $V_{SS}$ through transistors 110 and 104.

Figure 2B:
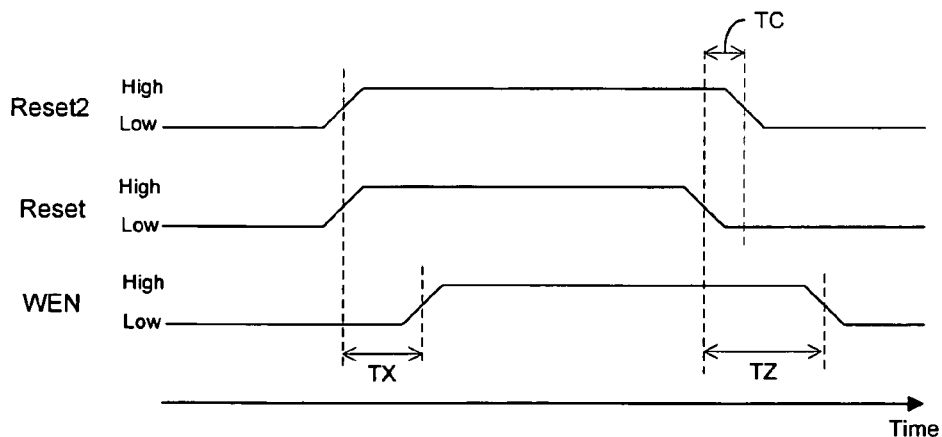
FIG. 2B is a timing diagram that illustrates examples of three input signals that can be used to write data to the memory cell of FIG. 1.

According to the present invention, transistors 101 and 112 block current flow between $V_{CC}$ and $V_{SS}$ during a write phase. FIG. 2B is a timing diagram that illustrates examples of waveforms for the voltages at the Reset, Reset2, and WEN terminals during a write phase.

As shown in FIG. 2B, the control voltages applied to terminals Reset and Reset2 go HIGH to cause transistors 101 and 112 to turn OFF, while V1 changes state. The voltage at WEN is pulled HIGH a period of time TX after the voltages at Reset and Reset2 go HIGH.

If WIN is pulled LOW, turning transistor 112 OFF blocks the current path between $V_{CC}$ and $V_{SS}$ through transistors 104 and 110. Because current paths between the high and low supply voltage are cut off while voltage V1 changes state, power consumption is reduced.

After V1 is changes state, the control voltages applied to Reset and Reset2 go LOW, causing transistors 101 and 112 to turn ON. Inverter 120 then causes the voltage at COUT to change state during time TZ, while the voltage at WEN remains HIGH.

A HIGH bit can be stored into memory cell 100 by applying a HIGH voltage ($V_{CC}$) at WIN and turning transistor 1040N. Unwanted current can flow between $V_{CC}$ and $V_{SS}$ through transistors 104 and 111 while V1 is pulled HIGH. To block current flow during this time period, an additional NMOS transistor (now shown) can be coupled between transistor 111 and VSS. This additional transistors is turned OFF to block current and reduce power consumption while V1 is pulled HIGH.

Figure 3:
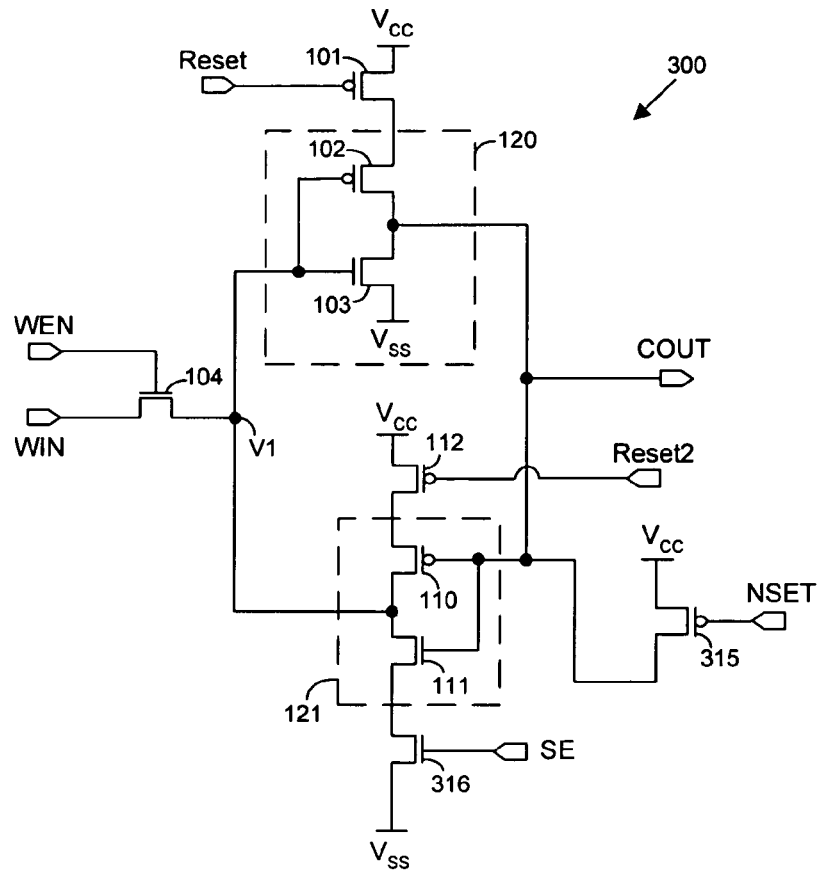
FIG. 3 is a schematic diagram of a memory cell with reduced power consumption according to another embodiment of the present invention.

Similar techniques can be used to reduce power consumption while memory cell 100 is set. In FIG. 3, a CRAM circuit 300 is shown with a preset configuration. Relative to circuit 100 of FIG. 1, transistor 115 is replaced by a p-channel transistor 315 in circuit 300. Also, n-channel transistor 316 has been added. Transistor 315 is controlled by a signal NSET. By bringing NSET LOW, the voltage at COUT is pulled HIGH through transistor 315, and CRAM circuit 300 is set.

Figure 4:
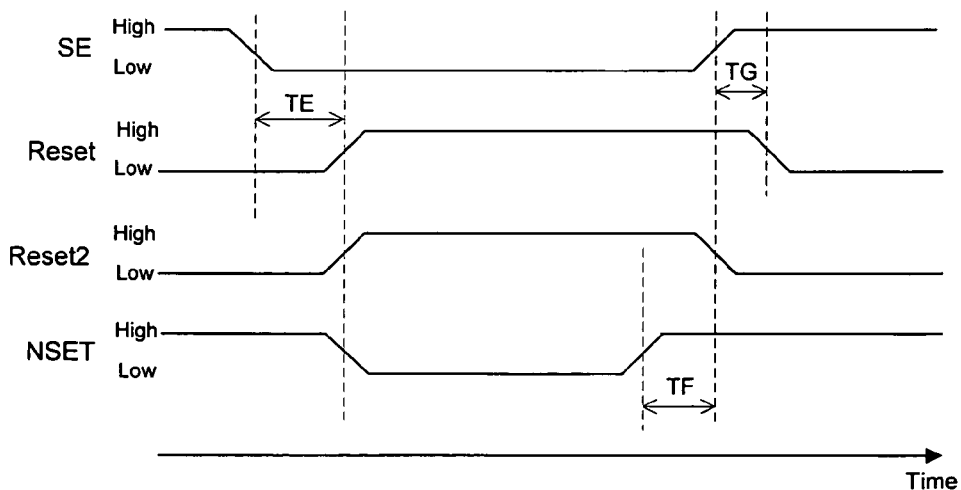
FIG. 4 is a timing diagram that illustrates examples of four input signals that can be used to write data to the memory cell of FIG. 3.

The timing waveform shown in FIG. 4 illustrates how the CRAM control input signals are sequenced to achieve a low power CRAM set function. Before CRAM 300 is set, the voltage at SE is pulled LOW to turn off transistor 316 as shown in FIG. 4. The voltage at NSET is then pulled LOW to turn on transistor 315 a period of time TE later. At the same time, signals Reset and Reset2 are pulled HIGH, turning off transistors 101 and 112, respectively. Turning transistor 316 off prevents current from flowing from $V_{CC}$ to $V_{SS}$ through transistors 102 and 111 during the set cycle.

At the end of the set cycle, NSET is pulled HIGH to turn off transistor 315. A period of time TF later, the signal at Reset2 goes LOW, and the signal at SE goes HIGH. A period of time TG after that, the signal at Reset goes LOW.

Figure 5:
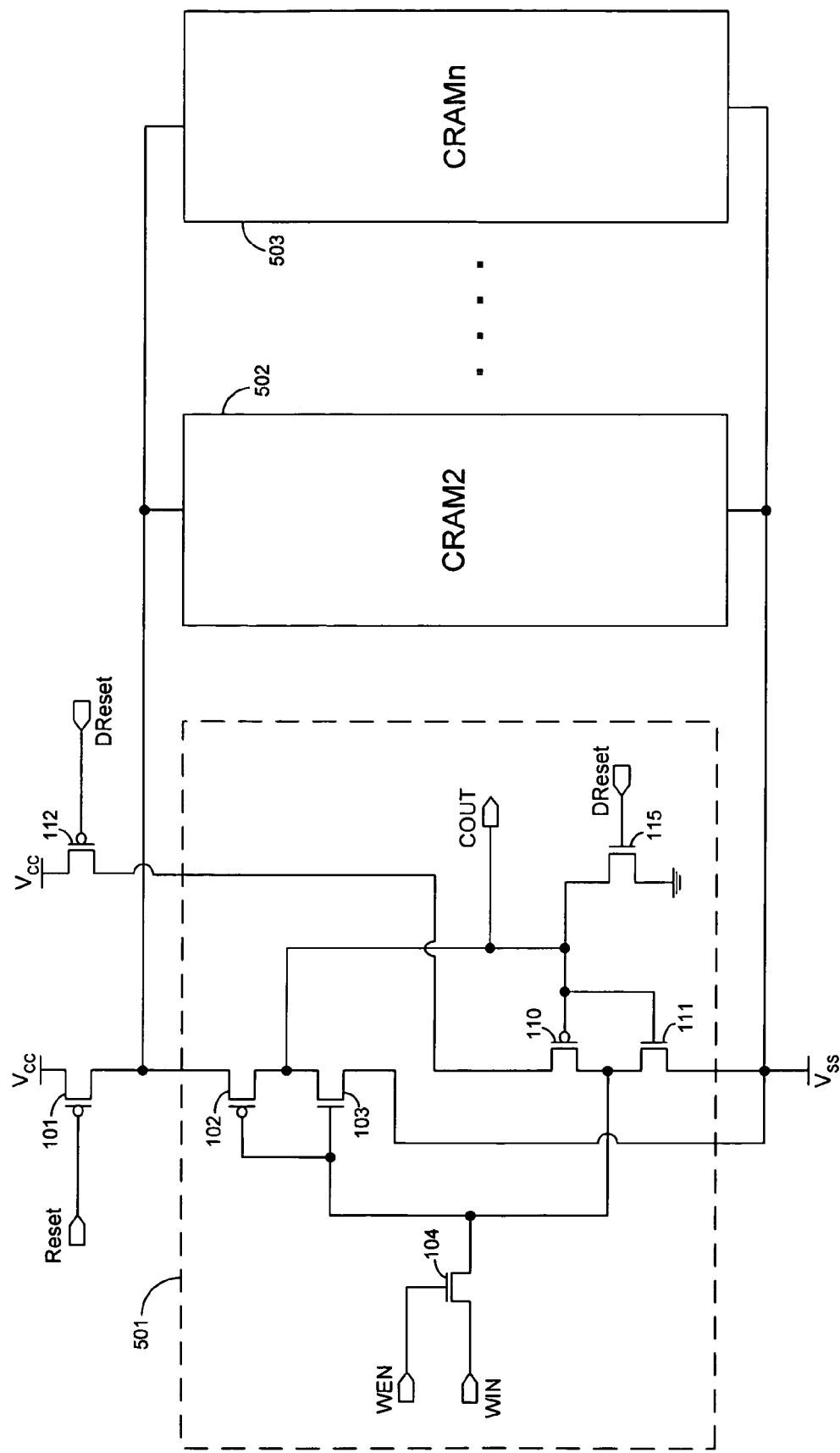
FIG. 5 is a schematic of a set of CRAM cells with reduced power consumption according to another embodiment of the present invention.

FIG. 5 illustrates an alternative embodiment of the present invention. In the embodiment of FIG. 5, one transistor 101 and one transistor 112 are coupled between the power supply $V_{CC}$ and multiple CRAM cells. The embodiment of FIG. 5 requires less transistors to provide a reduction in power consumption during state changes.

The embodiment of FIG. 5 is useful in circuits that have readily available metal routing. Transistors 101 and 112 can be placed at a central location and routed to control multiple CRAM cells. If metal routing is limited on the circuit, transistors 101 and 112 can be placed in each CRAM cells as in FIG. 1.

Each CRAM cell 501–503 in FIG. 5 includes two cross coupled inverters (102–103 and 110–111), a reset transistor 115, and a write transistor 104. PMOS transistor 101 is coupled between CRAM cells 501, 502 and 503 and high power supply $V_{CC}$. PMOS transistor 112 is coupled between CRAM cells 501, 502, and 503 and high power supply $V_{CC}$.

Transistors 101 and 112 can be coupled to supply current to any suitable number of CRAM cells. The size of transistors 101 and 112 must be selected so that they supply enough current to all of the CRAM cells they are coupled to. The transistors 101 and 112 in this embodiment need to be larger area transistors than in the embodiment of FIG. 1. In an alterative embodiment, transistor 316 is coupled between CRAM cells 501–503 and $V_{SS}$.

The techniques of the present invention apply to numerous types of circuits including application specific integrated circuits (ASICs) and programmable integrated circuits such as FPGAs. Numerous types of programmable integrated circuits contain SRAM memory blocks, in which the techniques of the present invention can be implemented to reduce power consumption.

Figure 6:
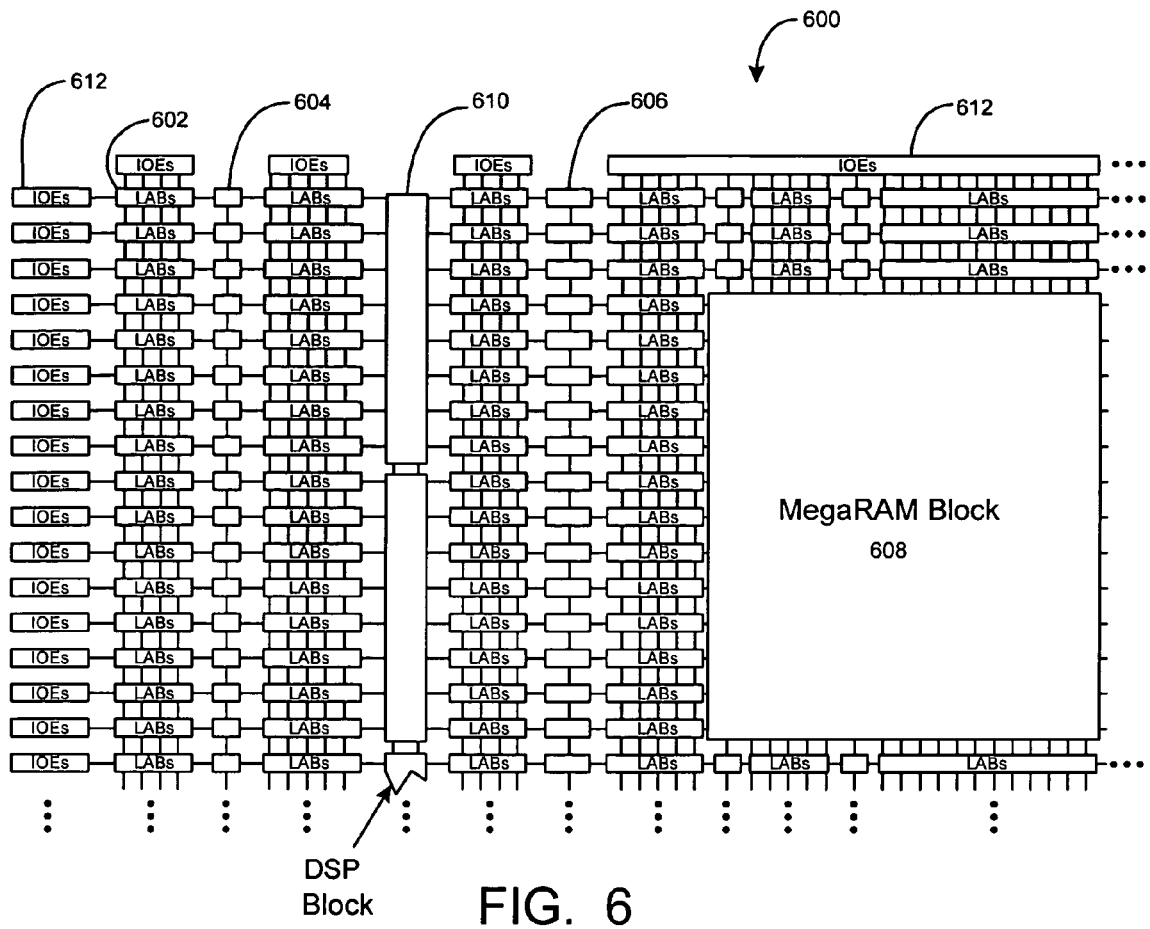
FIG. 6 is a simplified block diagram of a programmable logic device that can be used with the techniques of the present invention.

FIG. 6 is a simplified partial block diagram of a high-density PLD 600. PLD 600 is an example of a programmable integrated circuit in which techniques of the present invention can be implemented. PLD 600 includes a two-dimensional array of programmable logic array blocks (or LABs) 602 that are interconnected by a network of column and row interconnects of varying length and speed. LABs 602 include multiple (e.g., 10) logic elements (or LEs).

An LE is a programmable logic block that provides for efficient implementation of user defined logic functions. PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 600 also includes a distributed memory structure including RAM blocks of varying sizes provided throughout the array. Any of the RAM blocks can be control (CRAM) blocks according to the embodiments of the present invention. The RAM blocks include, for example, 512 bit blocks 604, 4 K blocks 606 and a MegaBlock 608 providing 512 K bits of RAM. These memory blocks can also include shift registers and FIFO buffers.

PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. It is to be understood that PLD 600 is described herein for illustrative purposes only and that the present invention can be implemented in many different types of PLDs, FPGAs, and the like.

Figure 7:
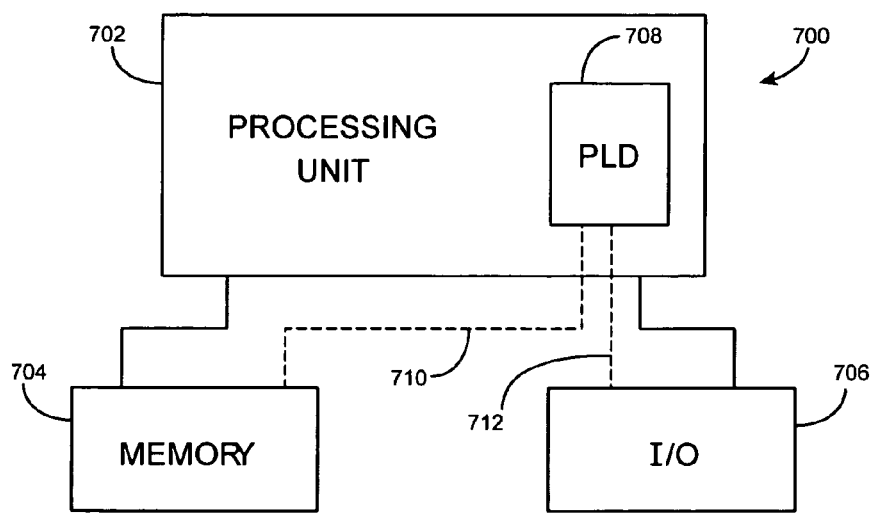
FIG. 7 is a block diagram of an electronic system that can implement embodiments of the present invention.

While PLDs of the type shown in FIG. 6 provide many of the resources required to implement system level solutions, the present invention can also benefit systems wherein a PLD is one of several components. FIG. 7 shows a block diagram of an exemplary digital system 700, within which the present invention can be embodied. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704 and an I/O unit 706 interconnected together by one or more buses. According to this exemplary embodiment, a programmable logic device (PLD) 708 is embedded in processing unit 702. PLD 708 can serve many different purposes within the system in FIG. 7. PLD 708 can, for example, be a logical building block of processing unit 702, supporting its internal and external operations. PLD 708 is programmed to implement the logical functions necessary to carry on its particular role in system operation. PLD 708 can be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 708 can control the logical operations of the system. In an embodiment, PLD 708 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. An integrated circuit comprising a memory cell, the memory cell comprising:

first and second cross coupled inverters, wherein an output of the first inverter is coupled to an output of the memory cell, and an output of the second inverter is coupled to an input of the memory cell;
a first transistor coupled between one of two power supply voltages and the first inverter, and having a gate coupled to receive a first control signal;
a second transistor coupled between one of the power supply voltages and the second inverter, and having a gate coupled to receive a second control signal,
wherein the first and the second transistors turn OFF in response to the first and the second control signals for a period of time when a voltage at the input or the output of the memory cell changes from a first logic state to a second logic state.

2. The integrated circuit according to claim 1 further comprising:
a third transistor having a drain coupled to the output of the memory cell and a gate coupled to receive a set signal that changes state during a set condition,
wherein the first and the second control signals cause the first and the second transistors to turn OFF during a portion of the set condition.

3. The integrated circuit according to claim 2 further comprising:
a fourth transistor coupled between one of the power supply voltages and the second inverter, and having a gate coupled to receive a third control signal,
wherein the fourth transistor turns OFF in response to the third control signal for a period of time when a voltage at the output of the memory cell is pulled HIGH.

4. The integrated circuit according to claim 1 further comprising:
a third transistor having a drain coupled to the output of the memory cell and a gate coupled to receive a reset signal that changes state during a reset condition,
wherein the first and the second control signals cause the first and the second transistors to turn OFF during a portion of the reset condition.

5. The integrated circuit according to claim 4 further comprising:
a fourth pass transistor coupled to the input of the memory cell, a write input terminal, and a write enable terminal,
wherein a third control signal at the write enable terminal causes the fourth pass transistor to turn ON allowing data to be written to the memory cell during a write period, and
the first and the second control signals cause the first and the second transistors to turn OFF during a portion of the write period.

6. The integrated circuit according to claim 1 further comprising:
a second memory cell comprising third and fourth cross coupled inverters, the third inverter being coupled to the first transistor, and the fourth inverter being coupled to the second transistor.

7. The integrated circuit according to claim 1 further comprising a second memory cell, the second memory cell comprising:
third and fourth cross coupled inverters coupled between an input and an output of the second memory cell;
a third transistor coupled between a power supply voltage and the third inverter, and having a gate coupled to receive a third control signal;
a fourth transistor coupled between a power supply voltage and the fourth inverter, and having a gate coupled to receive a fourth control signal,
wherein the third and the fourth transistors turn OFF in response to the third and the fourth control signals for a period of time when the voltage at the input or the output of the second memory cell changes from a first logic state to a second logic state.

8. The integrated circuit according to claim 1 wherein the integrated circuit is a field programmable gate array.

9. The integrated circuit according to claim 1 wherein the integrated circuit is an application specific integrated circuit.

10. A method for reducing power consumption in an integrated circuit comprising a memory cell having first and second cross coupled inverters, the method comprising:
turning OFF a first transistor that is coupled between a first supply voltage and a second transistor in the first inverter;
turning ON a third transistor to cause a voltage at an input terminal of the second inverter to change from a first state to a second state, wherein the first transistor blocks a current path from the first supply voltage to a second supply voltage through the second transistor and the third transistor; and
turning ON the first transistor to allow current to flow through the second transistor after the voltage at the input terminal of the second inverter reaches the second state.

11. The method as defined in claim 10 further comprising:
turning OFF a fourth transistor that is coupled between the second supply voltage and a fifth transistor in the second inverter;
turning ON a sixth transistor to cause a voltage at an input terminal of the first inverter to change from a first state to a second state, wherein the fourth transistor blocks a current path from the second supply voltage to the first supply voltage through the fifth transistor and the sixth transistor; and
turning ON the fourth transistor to allow current to flow through the fifth transistor after the voltage at the input terminal of the first inverter reaches the second state.

12. The method as defined in claim 10 wherein causing the voltage at the input terminal of the first inverter to change comprises:
turning ON the third transistor in response to a reset signal to pull a voltage at the input terminal of the first inverter LOW.

13. The method as defined in claim 10 wherein causing the voltage at the input terminal of the first inverter to change comprises:
turning ON the third transistor in response to a write signal to write a data bit into the memory cell.

14. The method as defined in claim 10 wherein the integrated circuit further comprises a second memory cell having third and fourth cross coupled inverters, and the method further comprises:
turning ON a fourth transistor to cause a voltage at an input terminal of the fourth inverter to change from a first state to a second state, wherein the first transistor blocks current flow between the first supply voltage and the second supply voltage through a fifth transistor in the third inverter and the fourth transistor; and
turning ON the fourth transistor to allow current to flow through the fifth transistor after the voltage at the input terminal of the fourth inverter reaches the second state.

15. The method as defined in claim 10 wherein the integrated circuit further comprises a second memory cell having third and fourth cross coupled inverters, and the method further comprises:

turning OFF a fourth transistor that is coupled between the first supply voltage and a fifth transistor in the third inverter;

turning ON a sixth transistor to cause a voltage at an input terminal of the fourth inverter to change from a first state to a second state, wherein the fourth transistor blocks current flow between the first supply voltage and the second supply voltage through the fifth transistor and the sixth transistor; and turning ON the first transistor to allow current to flow through the second transistor after the voltage at the input terminal of the second inverter reaches the second state.

16. An integrated circuit comprising a memory cell, the memory cell comprising:

first and second cross coupled inverters, wherein an output of the first inverter is coupled to an output of the memory cell, and an output of the second inverter is coupled to an input of the memory cell;

a first transistor coupled between a first power supply voltage and the first inverter, and having a gate coupled to receive a first control signal; and a second transistor coupled to the input of the memory cell and coupled to receive a write enable signal that changes state during a write phase, wherein the first control signal causes the first transistor to be OFF during a portion of the write phase.

17. The integrated circuit as defined in claim 16 further comprising:

a third transistor coupled between a second power supply voltage and the second inverter, and having a gate coupled to receive a second control signal, wherein the second control signal causes the third transistor to be OFF during a portion of the write phase.

18. The integrated circuit as defined in claim 16 further comprising:

a third transistor coupled between the first power supply voltage and the second inverter, and having a gate coupled to receive a second control signal, wherein the second control signal causes the third transistor to be OFF during a portion of the write phase.

19. The integrated circuit as defined in claim 16 wherein the integrated circuit is a programmable logic device.

20. The integrated circuit as defined in claim 19 wherein the programmable logic device is embedded within a processing unit.

* * * * *